(12) United States Patent
Kim et al.

(10) Patent No.: US 8,183,570 B2
(45) Date of Patent: May 22, 2012

(54) THIN FILM TRANSISTOR ARRAY PANEL (75) Inventors: Dong-Gyu Kim, Yongin-si (KR);
Sung-Haeng Cho, Chungcheongbuk-do (KR); Hyung-Jun Kim, Seoul (KR);
Sung-Ryul Kim, Cheonan-si (KP);
Yong-Mo Choi, Osan-si (KR)

(73) Assignee: Samsung Electronics Oc., Ltd., Suwon-Si (KR)

( * ) Notice: Subject to any disclaimer, the term of this patent is extended or adjusted under 35 U.S.C. 154(b) by 25 days.

(21) Appl. No.: 12/946,953

(22) Filed: Nov. 16, 2010

(65) Prior Publication Data
US 2011/0057194 A1  Mar. 10, 2011

Related U.S. Application Data (62) Division of application No. 12/401,959, filed on Mar. 11, 2009, now Pat. No. 7,838,886.

(30) Foreign Application Priority Data

Aug. 26, 2008 (KR) .................. 10-2008-0083303

(51) Int. Cl.
*H01L 29/04* (2006.01)

(52) U.S. Cl. .................. 257/72; 257/49; 257/59

(58) Field of Classification Search .................. 257/72, 257/49, 59
See application file for complete search history.

(56) References Cited

U.S. PATENT DOCUMENTS

| 5,932,892 A | 8/1999 | Hseuh et al. |
| 7,199,396 B2 | 4/2007 | Lebrun |

FOREIGN PATENT DOCUMENTS

| JP | 07-092499 | 4/1995 |
| JP | 08-179374 | 7/1996 |
| JP | 09-026603 | 1/1997 |
| JP | 11-052429 | 2/1999 |
| JP | 2000-267128 | 9/2000 |
| KR | 100260359 B1 | 4/2000 |
| KR | 100642088 B | 10/2006 |
| KR | 100700485 B | 3/2007 |
| KR | 100702342 B | 3/2007 |
| KR | 100807581 B | 2/2008 |

*Primary Examiner* — Long Pham
(74) *Attorney, Agent, or Firm* — F. Chau & Associates, LLC (57) ABSTRACT

A thin film transistor array panel, in which a middle storage electrode and a storage electrode overlapping a drain electrode of a thin film transistor thereby forming a storage capacitance are formed. Accordingly, sufficient storage capacitance may be formed without a decrease of the aperture ratio and light transmittance of a liquid crystal display. Also, the capacitance may be sufficiently formed through the connecting member connected to a gate metal layer.

6 Claims, 9 Drawing Sheets

FIG.9

THIN FILM TRANSISTOR ARRAY PANEL

CROSS-REFERENCE TO RELATED APPLICATION

This application is a Divisional Application of U.S. patent application Ser. No. 12/401,959 filed on Mar. 11, 2009 now U.S. Pat. No. 7,838,886, which claims priority to and the benefit of Korean Patent Application No. 10-2008-0083303 filed in the Korean Intellectual Property Office on Aug. 26, 2008, the entire contents of which are incorporated herein by reference.

BACKGROUND (a) Technical Field

The present disclosure relates to a thin film transistor array panel.

(b) Discussion

A liquid crystal display is one of the flat panel displays that are now being widely used. The liquid crystal display includes two display panels in which field generating electrodes, such as pixel electrodes and a common electrode, are formed, and a liquid crystal layer is interposed between the display panels. In the liquid crystal display, a voltage is applied to the field generating electrodes to generate an electric field in the liquid crystal layer, which determines the orientation of liquid crystal molecules of the liquid crystal layer, and an image is displayed by controlling the polarization of incident light.

In this liquid crystal display, it is important to appropriately maintain the various capacitances, such as a liquid crystal capacitance, a storage capacitance, and a parasitic capacitance.

The above information disclosed in this Background section is only for enhancement of understanding of the background of the invention and therefore it may contain information that does not form the prior art that is already known in this country to a person of ordinary skill in the art.

SUMMARY

A thin film transistor array panel according to an exemplary embodiment of the present invention comprises: a substrate; a gate line formed on the substrate and comprising a gate electrode; a storage electrode line formed on the substrate and comprising a storage electrode; a gate insulating layer formed on the gate line and the storage electrode line; a semiconductor layer formed on the gate insulating layer; a data line formed on the semiconductor layer and the gate insulating layer, and comprising a source electrode; a drain electrode facing the source electrode on the semiconductor layer; a lower layer formed on the drain electrode; a middle storage electrode formed on the lower layer and overlapping the drain electrode, thereby forming a first storage capacitance; an upper layer formed on the middle storage electrode; and a pixel electrode formed on the upper layer and connected to the drain electrode.

The middle storage electrode may overlap the pixel electrode, thereby forming a second storage capacitance.

The storage electrode may overlap the drain electrode, thereby forming a third storage capacitance.

The first storage capacitance may be in the range of about 1.5-2.5 times the third storage capacitance.

The second storage capacitance may be in the range of about 0.1-0.3 times the first storage capacitance.

The area of the middle storage electrode may be smaller than that of the drain electrode.

The upper layer may comprise an organic material.

The upper layer may be thicker than the lower layer.

The thin film transistor array panel may further comprise a color filter formed between the upper layer and the lower layer.

The thin film transistor array panel may further comprise a light blocking member formed on the lower layer.

The thin film transistor array panel may further comprise a middle storage electrode line formed on the upper layer and connected to the middle storage electrode.

The thin film transistor array panel may further comprise a storage voltage supplying line formed with the same layer as the data line, wherein the storage voltage supplying line is connected to the middle storage electrode line.

The storage voltage supplying line may be connected to the storage electrode line.

In an exemplary embodiment according to the present invention, a middle storage electrode and a storage electrode overlap a drain electrode of a thin film transistor, thereby forming a storage capacitance. Accordingly, sufficient storage capacitance may be formed without deterioration of the aperture ratio and the transmittance of the liquid crystal display.

Also, in an exemplary embodiment of the present invention, the capacitance may be sufficiently formed through the connecting member connected to the gate metal layer.

BRIEF DESCRIPTION OF THE DRAWINGS

Exemplary embodiments of the present invention will be understood in more detail from the following descriptions taken in conjunction with the attached drawings.

DETAILED DESCRIPTION OF EXEMPLARY EMBODIMENTS

In the following detailed description, only certain exemplary embodiments of the present invention have been shown and described, simply by way of illustration. As those of ordinary skill in the art would realize, the described exemplary embodiments may be modified in various different ways, all without departing from the spirit or scope of the present invention. Accordingly, the drawings and description are to be regarded as illustrative in nature and not restrictive, and like reference numerals designate like elements throughout the specification. Detailed descriptions of well-known techniques are omitted.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. On the other hand, when an element is referred to as being "directly on" another element, there are no intervening elements present. Further, it will be understood that when an element such as a layer, film, region, or substrate is referred to as being "under" another element, it can be directly under the other element or intervening elements may also be present. On the other hand, when an element is referred to as being "directly under" another element, there are no intervening elements present.

Now, a thin film transistor array panel according to an exemplary embodiment of the present invention and a liquid crystal display including the same will be described with reference to FIG. 1 to FIG. 4.

Figure 1:
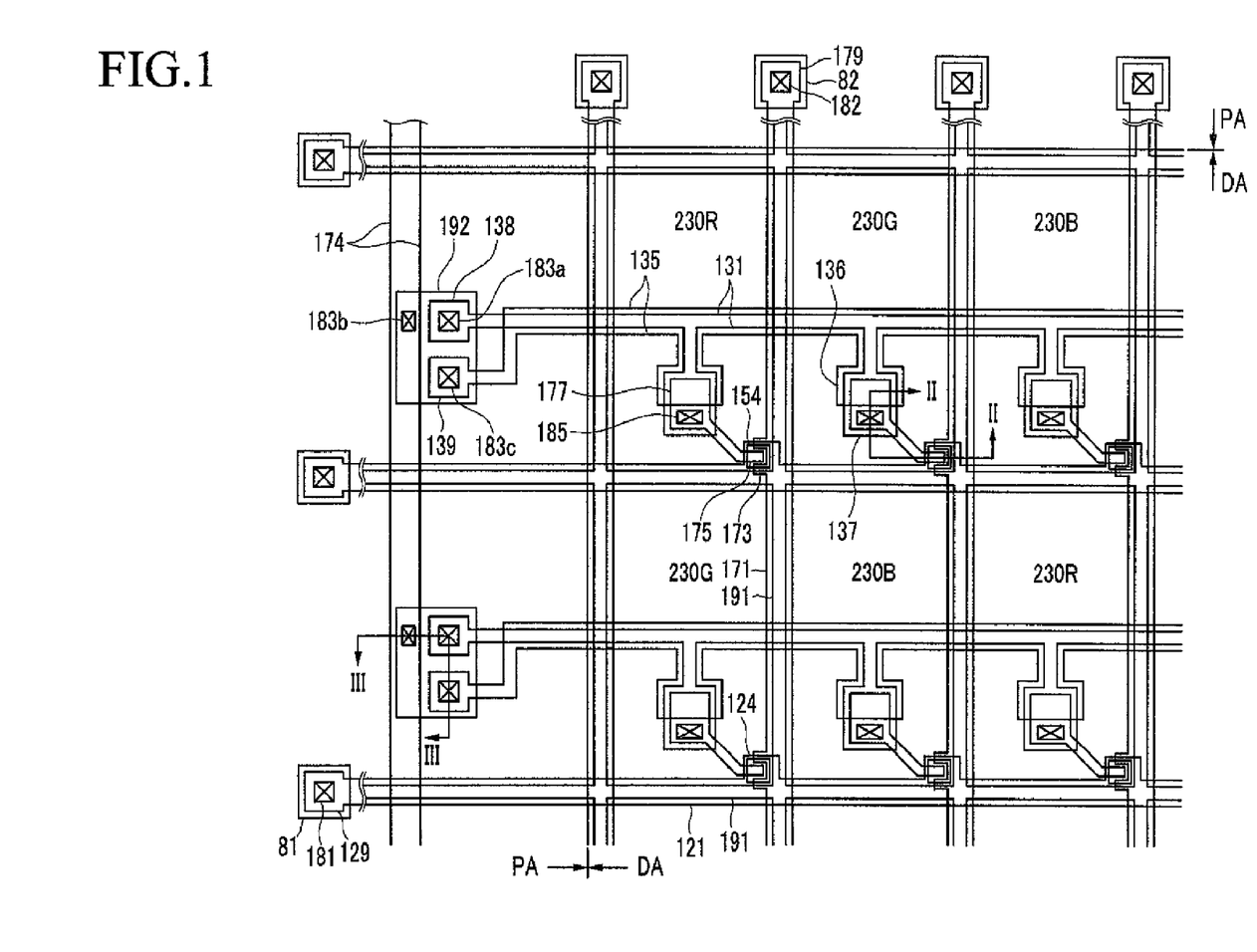
FIG. 1 is a layout view of a liquid crystal display according to an exemplary embodiment of the present invention.
Figure 2:
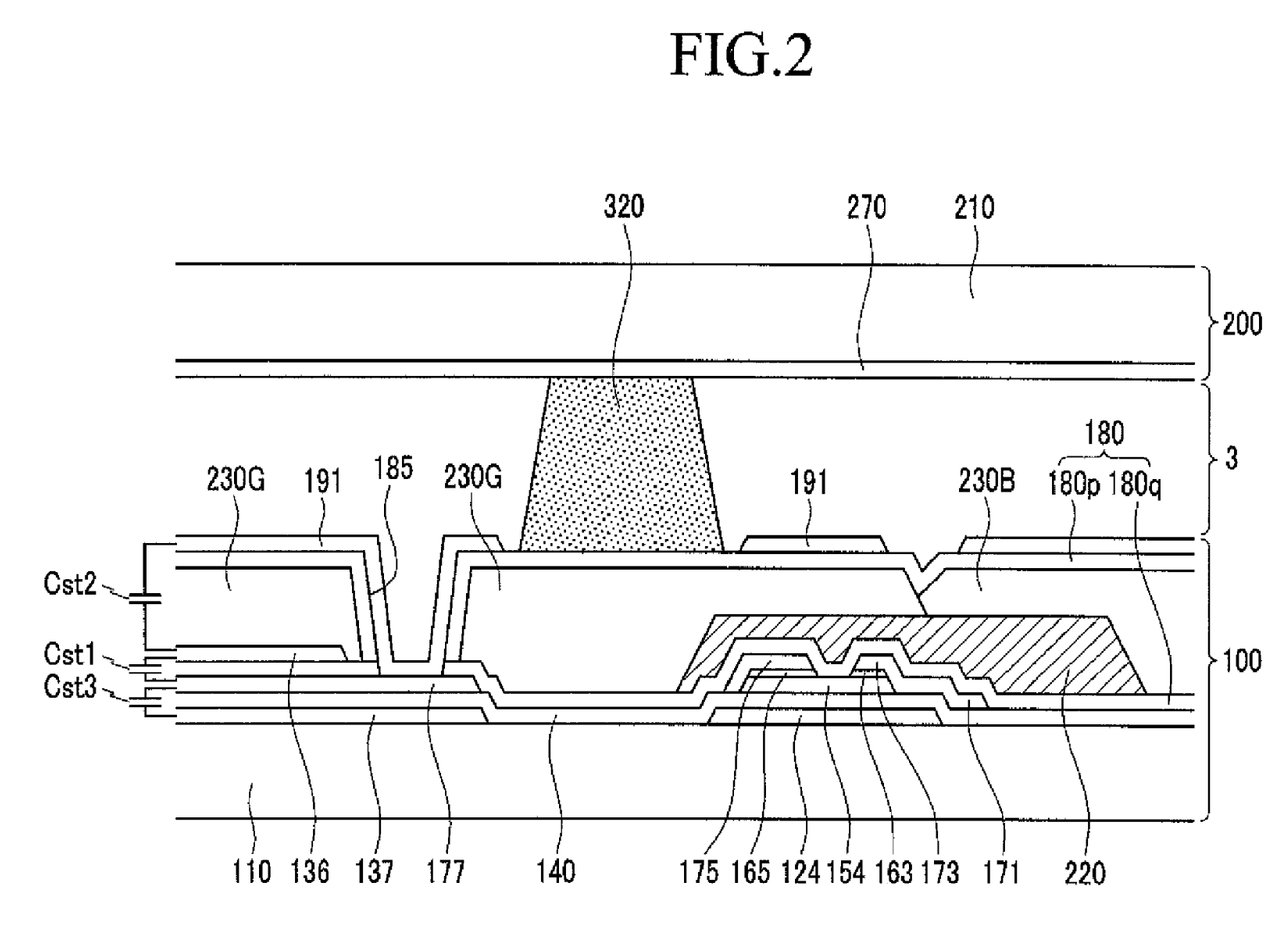
FIG. 2 is a cross-sectional view of the liquid crystal display shown in FIG. 1 taken along the line II-II.
Figure 3:
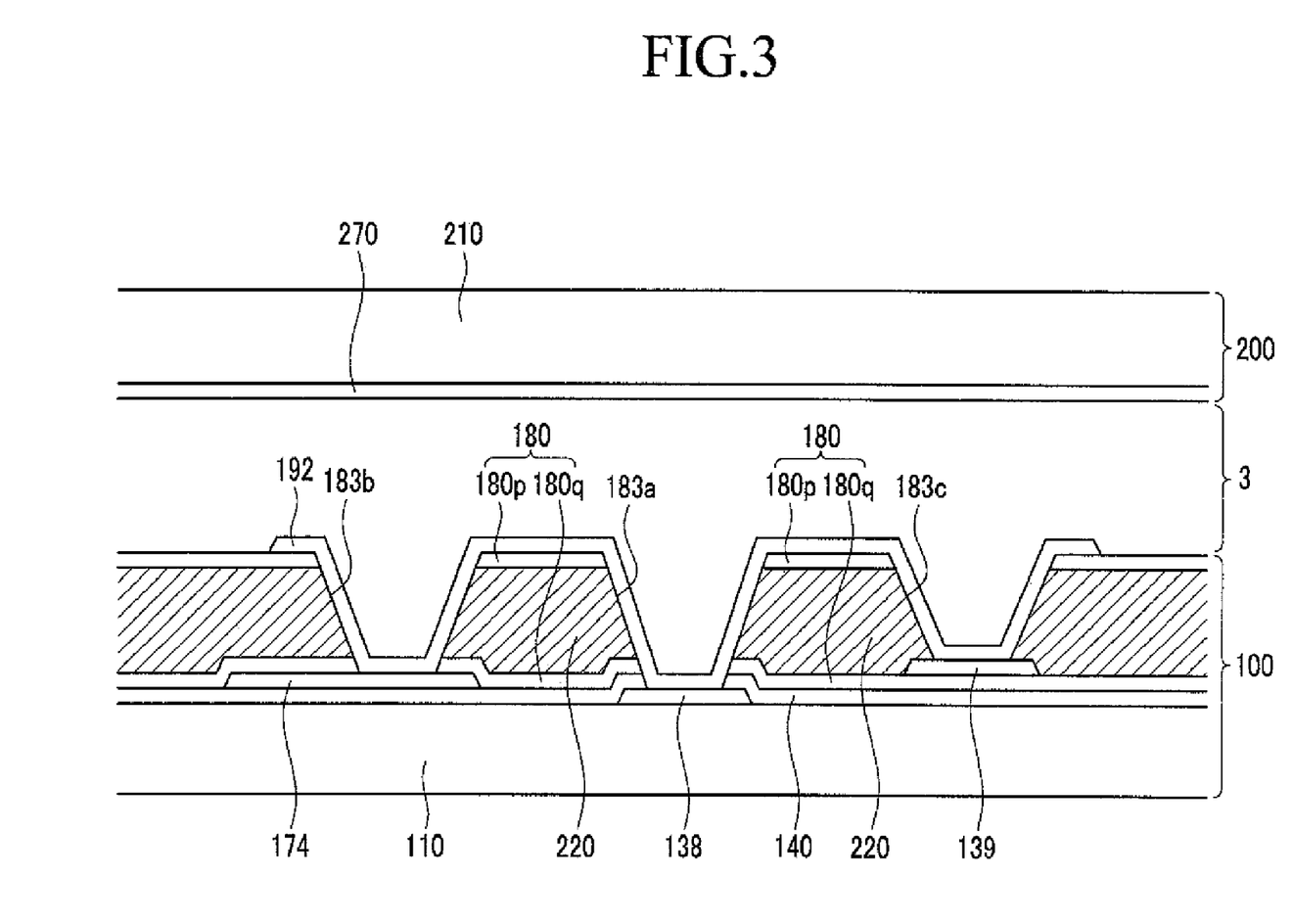
FIG. 3 a cross-sectional view of the liquid crystal display shown in FIG. 1 taken along the line III-III.
Figure 4:
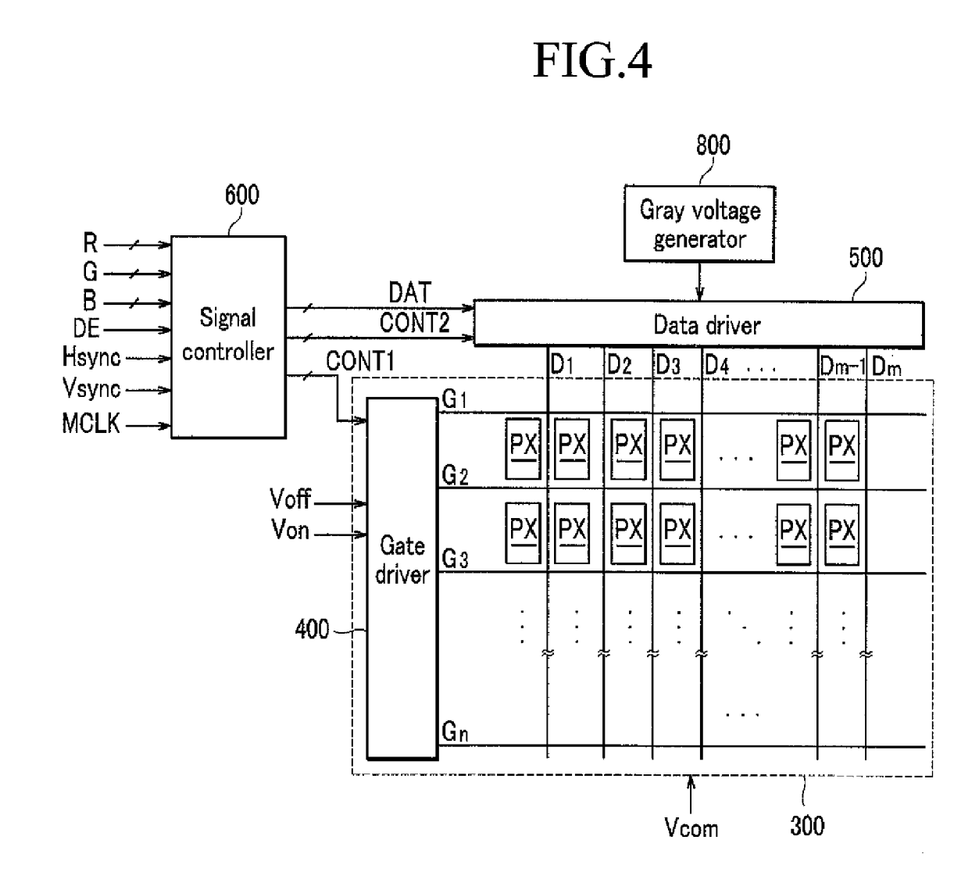
FIG. 4 is a block diagram of a liquid crystal display according to an exemplary embodiment of the present invention.

FIG. 1 is a layout view of a liquid crystal display according to an exemplary embodiment of the present invention, FIG. 2 is a cross-sectional view of the liquid crystal display shown in FIG. 1 taken along the line II-II, FIG. 3 a cross-sectional view of the liquid crystal display shown in FIG. 1 taken along the line III-III, and FIG. 4 is a block diagram of a liquid crystal display according to an exemplary embodiment of the present invention.

Referring to FIG. 1 to FIG. 3, a liquid crystal display according to an exemplary embodiment of the present invention includes a first display panel 100, a second display panel 200 and a liquid crystal layer 3.

The liquid crystal layer 3 has positive dielectric anisotropy. The liquid crystal molecules of the liquid crystal layer 3 are arranged such that a longitudinal axis of the liquid crystal molecules is parallel to the surfaces of the two panels in the case that an electric field does not exist.

Alignment layers (not shown) may be applied on inner surfaces of the first and second display panels 100 and 200, and may be horizontal alignment layers. At least one polarizer (not shown) may be attached on outside surfaces of the first and second display panels 100 and 200.

A display area DA of the liquid crystal display is a region for displaying images, and a peripheral area PA is disposed on the circumference of the display area DA and is formed with various wiring.

Initially, the first display panel 100 will be described.

A gate line 121 and a storage electrode line 131 are formed on a first insulating substrate 110 made of a material, such as transparent glass or plastic.

The gate line 121 transmits gate signals and extends in a transverse direction and includes a plurality of gate electrodes 124 protruding upward.

The storage electrode line 131 receives a predetermined voltage and is substantially parallel to the gate line 121. The storage electrode line 131 is disposed close to and under the gate line 121. The storage electrode lines 131 include a primary storage electrode 137 of an approximately square shape and a secondary storage electrode 136. The shape and arrangement of the storage electrode lines 131, however, may be variously changed. The storage electrode line 131 is electrically connected to a storage voltage supplying line 174 formed in the peripheral area PA of the liquid crystal display through a transparent connection 192. In this exemplary embodiment, in the connection portion, contact holes 183a and 183b are formed, the storage voltage supplying line 174 extends substantially in the longitudinal direction with the same layer as the data line 171. As a result, the storage electrode line 131 is applied with the storage voltage through the storage voltage supplying line 174.

A gate insulating layer 140 shown in FIG. 2 is preferably made of silicon nitride (SiNx) or silicon dioxide (SiOx) and is formed on the gate line 121 and the storage electrode line 131.

A semiconductor island 154 preferably made of hydrogenated amorphous silicon (simply referred to as a-Si) or a crystallized silicon is formed on the gate insulating layer 140. The semiconductor island 154 is disposed on the gate electrode 124.

A pair of ohmic contact islands 163 and 165 shown in FIG. 2 are formed on the semiconductor island 154. The ohmic contacts 163 and 165 are preferably made of n+ hydrogenated a-Si heavily doped with an N-type impurity such as phosphorous, or they may be made of a silicide.

Data lines 171 and drain electrodes 175 are formed on the ohmic contacts 163 and 165 and the gate insulating layer 140.

The data lines 171 transmit data voltages and extend in a longitudinal direction, thereby intersecting the gate lines 121. Each data line 171 is disposed parallel to the secondary storage electrode, and close to the gate electrode 124. The data line 171 includes a plurality of source electrodes 173 with a "U" shape that is inclined toward the side on the gate electrode 124. The source electrode 173, however, may have another shape besides the "U" shape.

The drain electrode 175 is separated from the data line 171, and includes a narrow portion and a wide portion 177. The narrow portion includes an end portion enclosed by the source electrode 173, and the wide portion 177 has an approximately square shape and overlaps the primary storage electrode 137. The wide portion 177 of the drain electrode 175 is generally smaller than the area of the primary storage electrode 137.

A gate electrode 124, a source electrode 173, and a drain electrode 175 form a thin film transistor (TFT) along with a semiconductor island 154, and the channel of the thin film transistor is formed in the semiconductor island 154 between the source electrode 173 and the drain electrode 175.

The ohmic contact islands 163 and 165 are interposed only between the underlying semiconductor islands 154 and the overlying data lines 171 and drain electrodes 175 thereon, and reduce contact resistance therebetween. The semiconductor island 154 includes exposed portions that are not covered by the source electrodes 173 and the drain electrodes 175, and portions that are disposed between the data lines 171 and the drain electrodes 175.

A passivation layer 180 is formed on the data line 171, the drain electrode 175, and the exposed semiconductor island 154. The passivation layer 180 includes a lower layer 180q made of an inorganic insulator, such as silicon nitride or silicon oxide, and an upper layer 180p. The upper layer 180p may also be made of an organic insulator, and the upper layer 180p may be thicker than the lower layer 180q in this exemplary embodiment. At least one of the lower layer 180q and the upper layer 180p may be omitted. The passivation layer 180 has a contact hole 185 exposing the wide portion 177 of the drain electrode 175.

A middle storage electrode 136 comprising a conductive material such as copper is formed on the lower layer 180q. The middle storage electrode 136 is smaller than the drain electrode 177, and does not overlap the contact hole 185. The middle storage electrode 136 is connected to a middle storage electrode line 135. The middle storage electrode line 135 is disposed with the same layer as the gate line 121, extends substantially in the transverse direction, and overlaps the storage electrode line 131. The middle storage electrode line 135, however, need not be overlapped with the storage electrode line 131. Also, an end portion 139 of the middle storage electrode line 135 is electrically connected to the storage voltage supplying line 174 through the transparent connection 192 in the peripheral area PA of the liquid crystal display. In this exemplary embodiment, contact holes 183b and 183c are formed in the connection portion. As a result, the middle storage electrode 136 is supplied with the same storage voltage through the storage voltage supplying line 174 as the primary storage electrode 137.

As shown in FIG. 2, a first storage capacitance Cst1 is generated between the drain electrode 177 and the middle storage electrode 136, a second storage capacitance Cst2 is generated between the middle storage electrode 136 and the pixel electrode 191, and a third storage capacitance Cst3 is generated between the drain electrode 177 and the primary storage electrode 137. Accordingly, the total storage capacitance is increased due to the middle storage electrode 136, because only the third storage capacitance Cst3 is generated when the middle storage electrode 136 does not exist. As a result, the aperture ratio and the transmittance does not decrease, because the area of the drain electrode 177 and the primary storage electrode 137 need not be enlarged in order to increase the storage capacitance. For example, in order to form the same capacitance as the total storage capacitance Cst1, Cst2, Cst3 under the formation of the middle storage electrode 136, the areas of the drain electrode 177 and the primary storage electrode 137 would have to be increased about three times in a liquid crystal display which does not include the middle storage electrode 136, which means the aperture ratio and the transmittance would be decreased. That is, the liquid crystal display according to an exemplary embodiment of the present invention has a larger aperture ratio and transmittance than those of a liquid crystal display having about a three-times larger area of the drain electrode 177 and the primary storage electrode 137, without the middle storage electrode 136. The capacitance Cst1 may be about 1.5-2.5 times that of the capacitance Cst3, and the capacitance Cst2 may be about 0.1-0.3 times that of the capacitance Cst 3.

A light blocking member 220 is formed on the lower passivation layer 180q. The light blocking member 220 prevents light from being transmitted through the region where the liquid crystal molecules of the liquid crystal layer 3 are not controlled and prevents external light from being reflected. The light blocking member 220, however, need not be formed in the first display panel 100, but may be formed in the second display panel 200.

A red color filter 230R, a green color filter 230G, and a blue color filter 230B shown in FIG. 1 are formed between the upper passivation layer 180p and the lower passivation layer 180q. The red color filter 230R occupies the region between neighboring data lines 171. The left and right boundaries of the red color filter 230R are disposed on the data lines 171 and may extend according to the data lines 171 in the longitudinal direction, and the red color filter 230R may have a band shape. The red color filter 230R has the contact hole 185 disposed on the wide portion 177 of the drain electrode 175. The red color filter 230R may be made of a photosensitive organic material including pigments. The red color filter 230R, however, may be formed on a second display panel 200 shown in FIG. 2 rather than on the first display panel 100, and the upper passivation layer 180p may be omitted in this case. The above description of the red color filter 230R applies substantially as well to the green color filter 230G and the blue color filter 230B and thus a further explanation is omitted.

A pixel electrode 191 is formed on the upper passivation layer 180p. The pixel electrode 191 may be made of a transparent conductive material such as ITO or IZO. When the color filters 230R, 230G, and 230B are formed in the second display panel 200, the pixel electrode 191 may be made of a reflective metal, such as aluminum, silver, chromium, or alloys thereof.

The pixel electrode 191 is connected to the drain electrodes 175 of the thin film transistors through the second contact hole 185, and is applied with data voltages from the drain electrodes 175. The pixel electrode 191 supplied with the data voltages generates an electric field along with a common electrode 270 of the second display panel 200, which determines the orientations of the liquid crystal molecules of the liquid crystal layer 3 disposed between the electrodes 191 and 270. Accordingly, the luminance of the light transmitted through the liquid crystal layer 3 differs depending on the determined orientation of the liquid crystal molecules.

The pixel electrode 191 and the common electrode 270 form a liquid crystal capacitor and maintain the voltage applied to the pixel electrode after the thin film transistor is turned off.

The pixel electrode 191 and the drain electrode 175 connected thereto, and the storage electrode line 131 including the primary storage electrode 137 and the second storage electrode 133, are overlapped with each other to thereby form the storage capacitor.

A spacer 320 shown in FIG. 2 is made of an organic material and is disposed in the display area DA shown in FIG. 1. Also, the spacer maintains the thickness or interval of the liquid crystal layer 3.

Next, the second display panel 200 will be described.

The common electrode 270 is formed on a second insulating substrate 210 made of transparent glass or plastic. The common electrode 270 is made of the transparent conductor such as ITO and IZO, and receives a common voltage.

An alignment layer (not shown) may be formed on the common electrode 270.

Next, a manufacturing method of the thin film transistor array panel according to an exemplary embodiment of the present invention will be described with reference to FIGS. 1-3.

A gate metal layer (not shown) is deposited on a first substrate 110. Next, the exposure process using a mask including a transmitting region and a light blocking region is executed, and the mask includes patterns corresponding to a gate line 121, a gate electrode 124, storage electrode lines 131 and 138, a primary storage electrode 137. After exposing, a developing process using an organic solvent is executed. Next, if necessary, an etch process may be executed. As a result, the gate line 121, the gate electrode 124, the storage electrode lines 131 and 138, and the primary storage electrode 137 are formed on the first substrate 110.

A gate insulating layer 140 having a substantially uniform thickness is formed on a gate metal layer (not shown).

A semiconductor layer and an ohmic contact layer are sequentially deposited on the gate insulating layer 140, and then exposed, developed, and etched to form a semiconductor island 154 and ohmic contacts 163 and 165.

A data metal layer (not shown) is deposited on the ohmic contacts 163 and 165 and patterned by using a mask having a pattern corresponding to a data line 171, a source electrode 173, a drain electrode 175, and a storage voltage supplying line 174. Next, the data line 171, the source electrode 173, the drain electrode 175, and the storage voltage supplying line 174 are formed through exposure, developing, and etching processes.

The semiconductor layer and the ohmic contact layer as well as the data metal layer (not shown) may be sequentially deposited on the gate insulating layer 140, however, and then the exposure, developing, and etching processes may be executed. In this case, the time and cost of the manufacturing process of the liquid crystal display may be reduced.

A lower passivation layer 180q is deposited on the data metal layer (not shown).

A metal layer (not shown) is deposited on the lower passivation layer 180q, and a mask is patterned to have a portion corresponding to a middle storage electrode 136 and middle storage electrode lines 135 and 139. Next, the middle storage electrode 136 and the middle storage electrode lines 135 and 139 are formed through exposure, developing, and etching processes.

A material for the formation of a light blocking member 220 shown in FIG. 2 is deposited on the middle metal layer (not shown), and patterned through the exposure and developing processes to form the light blocking member. The light blocking member 220, however, may be formed on the second display panel 200 rather than on the first display panel 100.

A red color filter 230R, a green color filter 230G, a blue color filter 230B shown in FIG. 1 are formed on the light blocking member 220 through deposition, exposure, and developing processes. The color filters 230R, 230G, and 230B, however, need not be formed on the first substrate 110.

An upper passivation layer 180p is deposited on the color filters 230R, 230G, and 230B, and is exposed and developed to form contact holes 183a, 183b, 183c, 185 shown in FIGS. 1 and 3.

A spacer 320 is formed on the upper passivation layer 180p through the deposition, exposure, and developing processes. The spacer 320, however, need not be formed on the first substrate 110.

A transparent conductive layer (not shown) is deposited on the upper passivation layer 180p, and a portion corresponding to a pixel electrode 191 and a transparent connection 192 are patterned in a mask. Next, the pixel electrode 191 and the transparent connection 192 are formed through the deposition, exposure, and developing processes. In this exemplary embodiment, the transparent connection 192 is electrically connected to the storage voltage supplying line 174, the storage electrode line 138, and the middle storage electrode line 139 through the contact holes 183a, 183b, and 183c.

A material for the spacer 320 is deposited on the transparent conductive layer (not shown), and is exposed and developed to form the spacer 320.

A liquid crystal layer 3 is formed on the pixel electrode 191. The liquid crystal layer 3, however, need not be formed on the first substrate 110.

Next, a thin film transistor array panel according to an exemplary embodiment of the present invention will be described with reference to FIG. 4 to FIG. 9.

Figure 5:
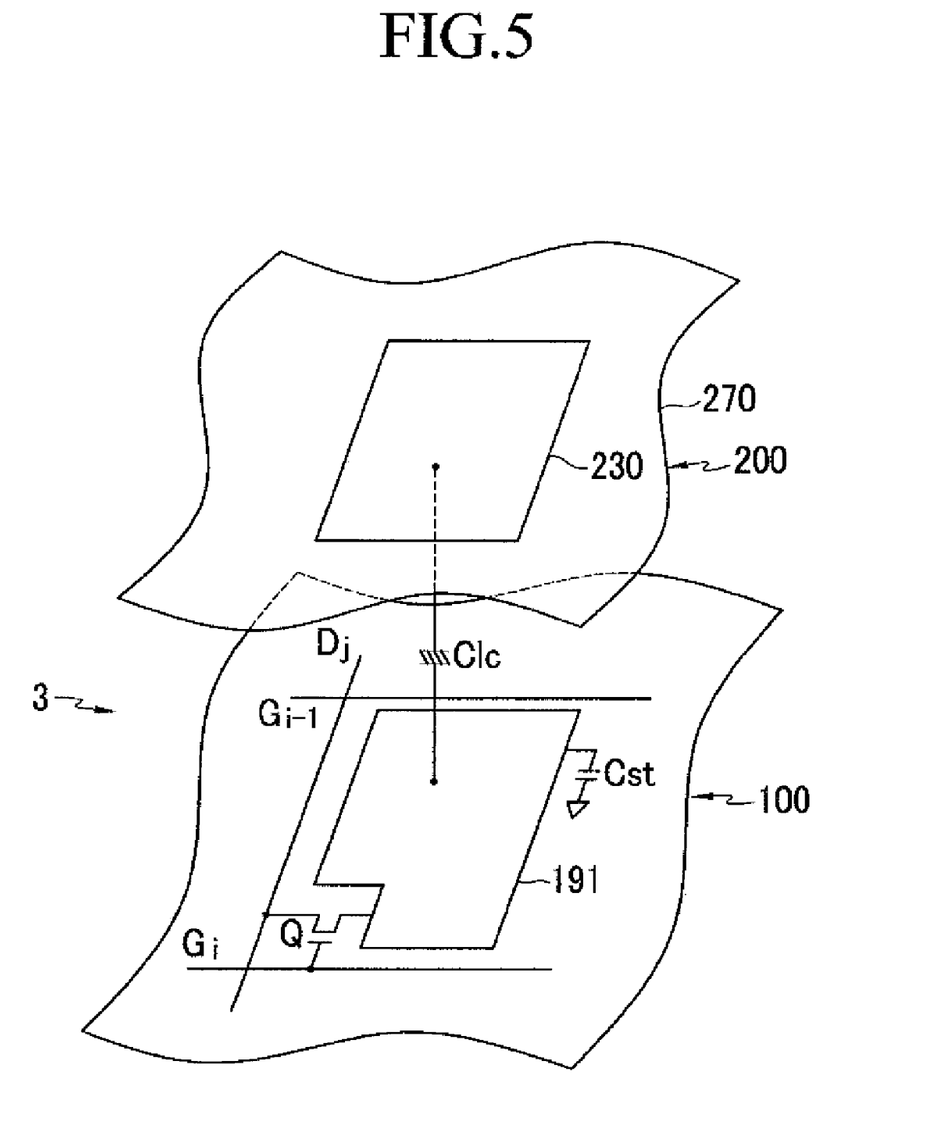
FIG. 5 is an equivalent circuit diagram of one pixel in the liquid crystal display according to an exemplary embodiment of the present invention.
Figure 6:
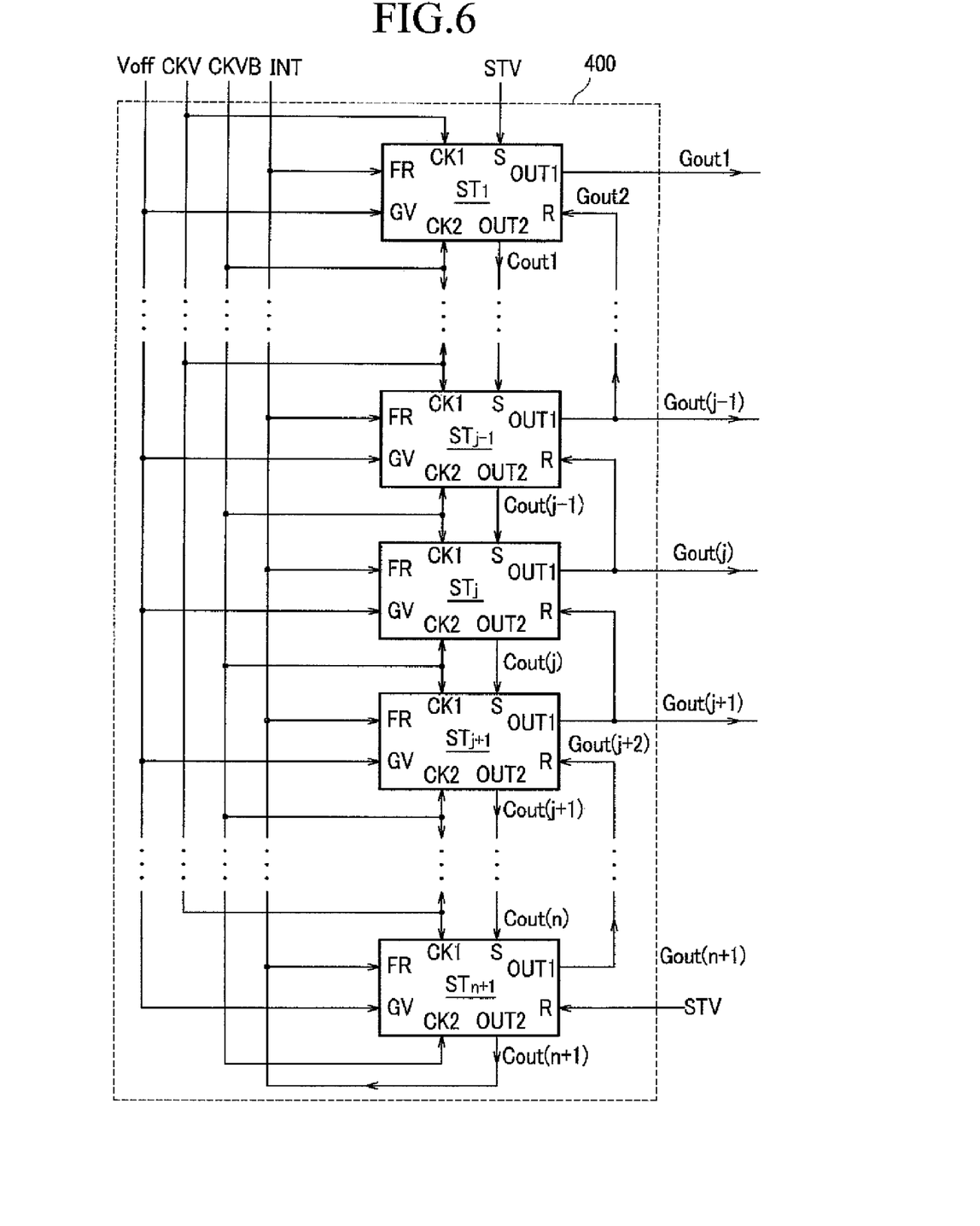
FIG. 6 is a block diagram of a gate driver according to an exemplary embodiment of the present invention.
Figure 7:
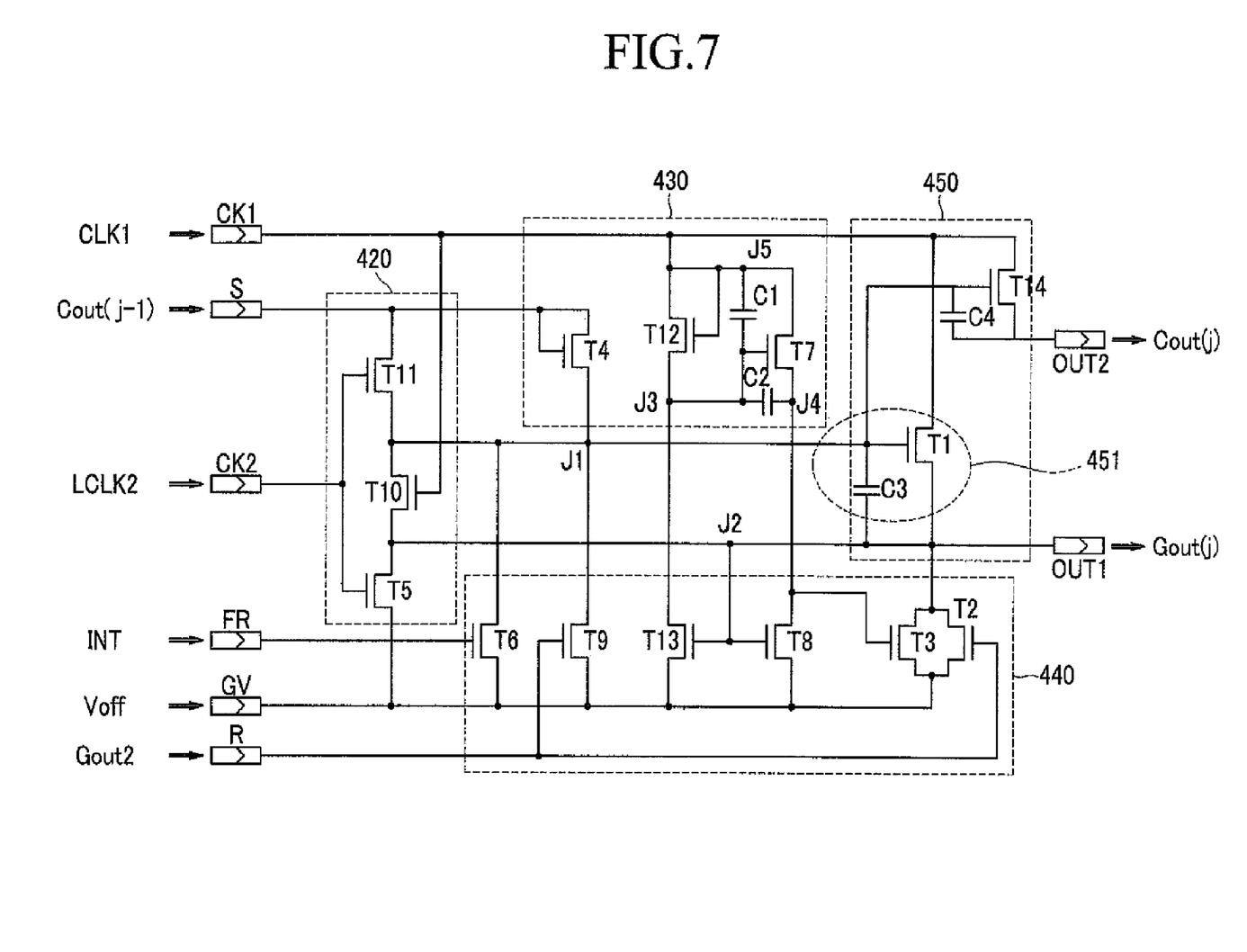
FIG. 7 is one example of a circuit of a j-th stage in the shift register for the gate driver shown in FIG. 6.
Figure 8:
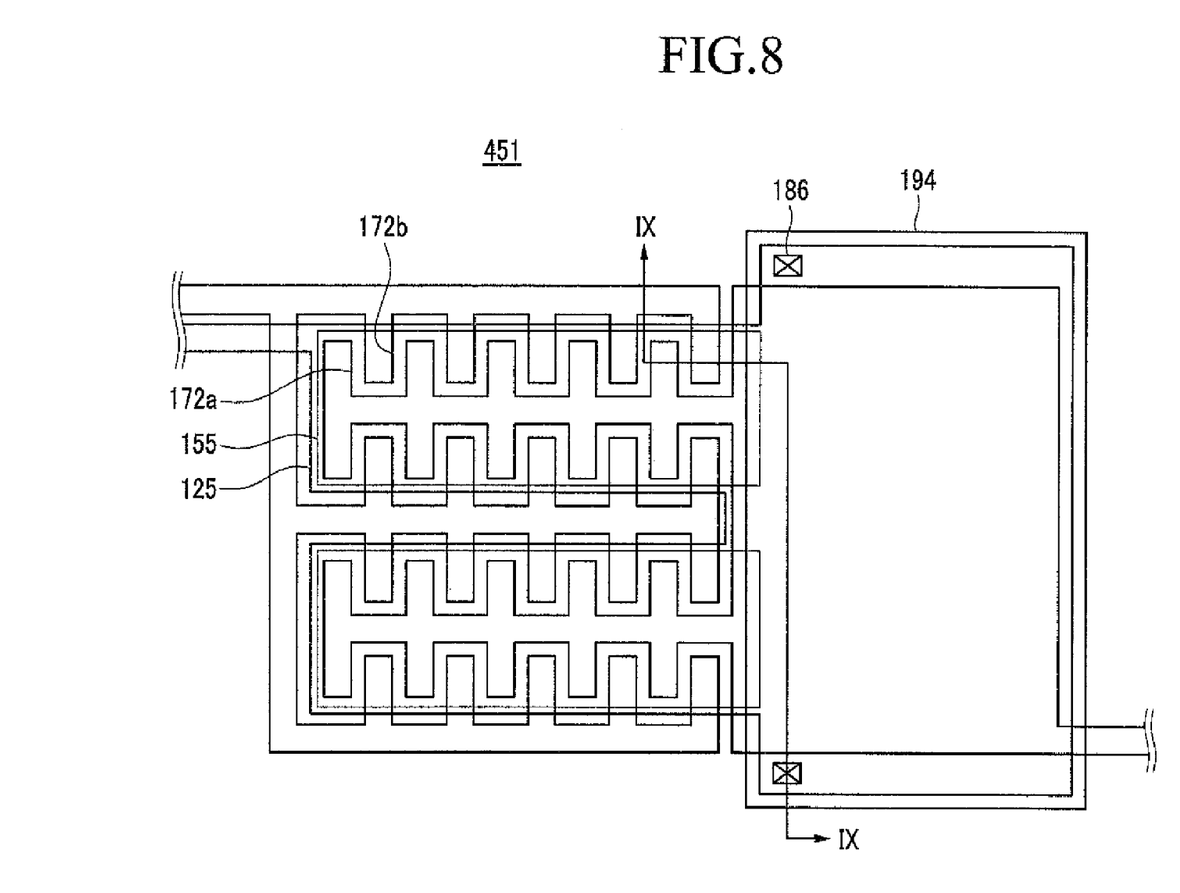
FIG. 8 is a layout view of the thin film transistor shown in FIG. 7.
Figure 9:
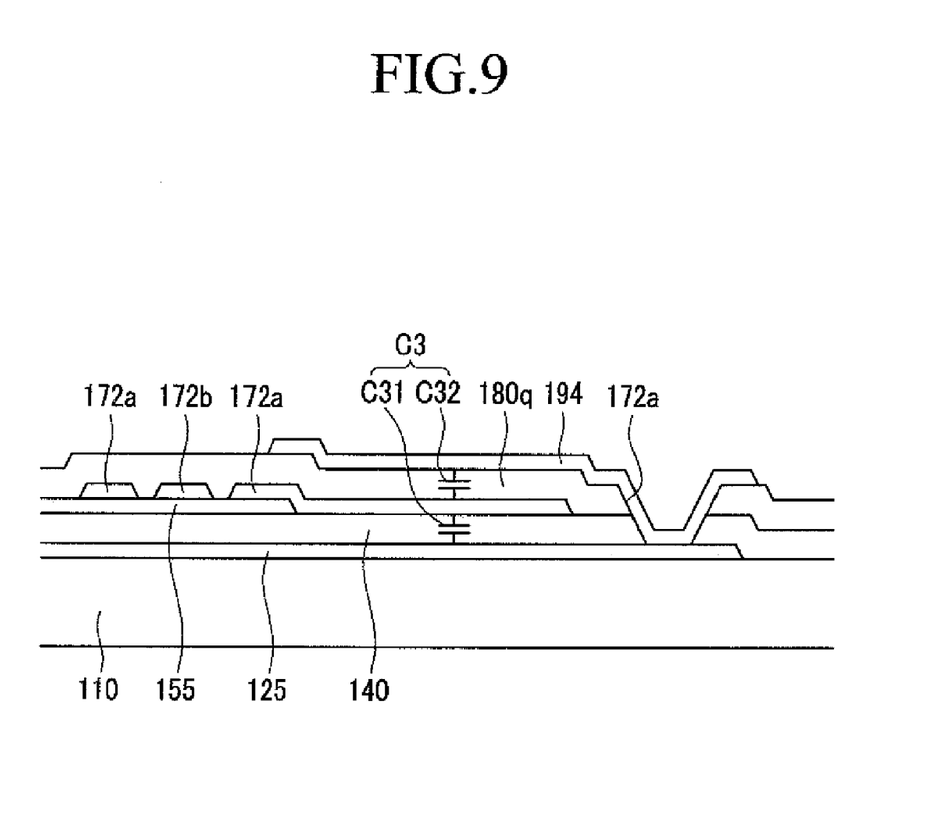
FIG. 9 is a cross-sectional view of the thin film transistor shown in FIG. 8 taken along the line IX-IX.

FIG. 4 is a block diagram of a liquid crystal display according to an exemplary embodiment of the present invention, FIG. 5 is an equivalent circuit diagram of one pixel in the liquid crystal display according to an exemplary embodiment of the present invention, FIG. 6 is a block diagram of a gate driver according to an exemplary embodiment of the present invention, FIG. 7 is one example of a circuit of a j-th stage in the shift register for the gate driver shown in FIG. 6, FIG. 8 is a layout view of the thin film transistor shown in FIG. 7, and FIG. 9 is a cross-sectional view of the thin film transistor shown in FIG. 8 taken along the line IX-IX.

As shown in FIG. 4 and FIG. 5, a liquid crystal display according to an exemplary embodiment of the present invention includes a liquid crystal panel assembly 300, a gate driver 400, a data driver 500, a gray voltage generator 800 connected to the data driver 500, and a signal controller 600 for controlling the gate driver 400 and the data driver 500.

As viewed in an equivalent circuit, the liquid crystal panel assembly 300 includes a plurality of signal lines G1-Gn and D1-Dm, and a plurality of pixels PX that are connected to the plurality of signal lines and disposed in a matrix form. Meanwhile, in a structure shown in FIG. 5, the liquid crystal panel assembly 300 includes lower and upper panels 100 and 200 that face each other, and a liquid crystal layer 3 that is interposed between the panels 100 and 200.

The signal lines G1-Gn and D1-Dm include a plurality of gate lines G1-Gn that transmit gate signals (also referred to as "scanning signals"), and a plurality of data lines D1-Dm that transmit data signals. The gate lines G1-Gn substantially extend in a row direction to be parallel to each other, and the data lines D1-Dm substantially extend in a column direction to be parallel to each other.

Each of the pixels PX includes a switching element Q connected to the signal lines G1-Gn and D1-Dm, and a liquid crystal capacitor Clc and a storage capacitor Cst connected thereto. The storage capacitor Cst may be omitted, if desired.

The switching element is a three terminal element such as a thin film transistor provided to the lower panel 100, wherein a control terminal thereof is connected to the gate line Gi, an input terminal thereof is connected to the data line Dj, and an output terminal thereof is connected to the liquid crystal capacitor Clc and the storage capacitor Cst.

The liquid crystal capacitor Clc includes two terminals formed of a pixel electrode 191 of the lower panel 100 and a common electrode 270 of the upper panel 200, and the liquid crystal layer 3 between the electrodes 191 and 270 serves as a dielectric material for the capacitor. The pixel electrode 191 is connected to the switching element Q, while the common electrode 270 is formed on the whole surface of the upper panel 200 and is applied with a common voltage Vcom. Unlike FIG. 2, the common electrode 270 may be formed on the lower panel 100, and at least one of the two electrodes 270 and 191 may have a linear shape or a bar shape.

Also, the storage capacitor Cst that serves as an auxiliary to the first/second liquid crystal capacitor is formed by overlapping the pixel electrode 191 and a separate signal line (not shown) with an insulator interposed therebetween. A predetermined voltage, such as the common voltage Vcom, is applied to the separate signal line. The storage capacitor Cst, however, may be formed by the pixel electrode 191 and the overlying previous gate line that are arranged to overlap each other via the insulator.

For color display, each pixel PX uniquely represents one of the primary colors (that is, spatial division) or each pixel PX sequentially represents the primary colors in turn (that is, temporal division), such that a spatial or temporal sum of the primary colors is recognized as a desired color. An example of a set of the primary colors includes red, green, and blue colors. FIG. 5 shows an example of the spatial division in which each pixel PX includes a color filter 230 representing one of the three primary colors in an area of the upper panel 200 facing the pixel electrode 191. Alternatively, unlike as shown in FIG. 5, the color filter 230 may be provided on or under the pixel electrode 191 on the lower panel 100.

At least one polarizer (not shown) for providing light polarization is provided in the liquid crystal panel assembly 300.

Referring again to FIG. 4, the gray voltage generator 800 generates all gray voltages or a predetermined number of the gray voltages (or reference gray voltages) related to light transmittance of the pixels PX. The (reference) gray voltages may include one set having a positive value for a common voltage Vcom, and another set having a negative value.

The gate driver 400 is connected to the gate lines G1 to Gn of the liquid crystal panel assembly 300, and applies gate signals obtained by combining a gate-on voltage Von for turning on the switching elements Q and a gate-off voltage Voff for turning them off to the gate lines G1 to Gn. The gate driver 400 includes a plurality of stages arranged in a row acting substantially as shift registers, and is integrated in the same manufacturing method as the thin film transistor Q and the signal lines G1-Gn and D1-Dm on the liquid crystal assembly 300.

The data driver 500 is connected to the data lines D1 to Dm of the liquid crystal panel assembly 300, and selects a gray voltage from the gray voltage generator 800 to apply it as a data signal to the data lines D1 to Dm. In a case where the gray voltage generator 800 does not provide respective voltages for every gray but only provides a predetermined number of reference gray voltages, however, the data driver 500 divides the reference gray voltages to generate gray voltages for the entire gray scale and selects a data signal from among them.

The signal controller 600 controls the gate driver 400 and the data driver 500.

Each of the drivers 500 and 600, and the generator 800 may be directly mounted as at least one integrated circuit (IC) chip on the liquid crystal panel assembly 300 or on a flexible printed circuit film (not shown) in a tape carrier package (TCP) type, which are attached to the liquid crystal panel assembly 300, or may be mounted on an additional printed circuit board (not shown). Alternatively, the drivers 500 and 600, and the generator 800 may be integrated with the panel assembly 300 along with the signal lines G1 to Gn and D1 to Dm and the switching elements Q. Additionally, the drivers 500 and 600, and the generator 800 may be integrated as a single chip. In this case, at least one of them or at least one circuit device constituting them may be located outside the single chip.

An operation of the liquid crystal display will now be described in detail.

The signal controller 600 receives input image signals R, G, and B and input control signals for controlling the display thereof from an external graphics controller (not shown). The input control signals may include a vertical synchronization signal Vsync, a horizontal synchronization signal Hsync, a main clock signal MCLK, and a data enable signal DE.

After generating gate control signals CONT1 and data control signals CONT2 and processing the image signals R, G, and B to be suitable for the operation condition of the panel assembly 300 on the basis of the input control signals and the input image signals R, G, and B, the signal controller 600 provides the gate control signals CONT1 for the gate driver 400, and the processed image signals DAT and the data control signals CONT2 for the data driver 500.

The gate control signal CONT1 includes a scan start signal STV shown in FIG. 6 for starting a scan operation, and at least one clock signal for controlling an output period of a gate on voltage Von. Further, the gate control signal CONT1 may include an output enable signal for defining a duration of the gate-on voltage Von.

The data control signals CONT2 include a horizontal synchronization start signal for informing the start of data transmission for a row (or a group) of pixels, a load signal for instructing to apply the data signals to the data lines D1-Dm, and a data clock signal. The data control signal CONT2 may further include an inversion signal for inverting the polarity of the voltages of the data signals with respect to the common voltage Vcom, hereinafter "the polarity of the voltages of the data signals with respect to the common voltage" is abbreviated as "the polarity of the data signals".

In response to the data control signals CONT2 from the signal controller 600, the data driver 500 receives the digital image signals DAT for a row (or a group) of pixels from the signal controller 600, converts the digital image signals DAT into analog data signals by selecting gray voltages corresponding to the respective digital image signals DAT, and applies the digital image signals DAT to the data lines D1-Dm.

The gate driver 400 applies the gate-on voltage Von to the gate lines G1 to Gn in response to the gate control signals CONT1 from the signal controller 600, so as to turn on the switching elements Q connected thereto. Thereby, the data voltages applied to the data lines D1-Dm are supplied to the pixels PX through the turned-on switching elements Q shown in FIG. 5.

The difference between the voltage of the data signals applied to a pixel PX and the common voltage Vcom is expressed as a charged voltage of the liquid crystal capacitor Clc, that is, a pixel voltage. The liquid crystal molecules have orientations depending on magnitude of the pixel voltage so as to change the polarization of light passing through the liquid crystal layer 3. The change of the polarization is converted into a change of light transmittance by the polarizer attached to the liquid crystal panel assembly 300.

The above operation is repeatedly performed by a unit of a horizontal period 1H corresponding to one period of the horizontal synchronization signal Hsync and the data enable signal DE, such that the gate-on voltage Von is sequentially applied to all the gate lines G1 to Gn and the data voltage is applied to all the pixels, so as to display an image of one frame.

After one frame ends, a subsequent frame is started, and a state of the inversion signal applied to the data driver 500 to invert the polarity of the data voltage applied to each pixel PX from the polarity in a previous frame is controlled, which is referred to as a "frame inversion. In this case, in one frame, the polarity of the data voltage flowing through one data line may be periodically changed according to characteristics of the inversion signal, for example, row inversion or dot inversion, or the polarities of the data voltage applied to one pixel row may be different, for example, column inversion or dot inversion.

Referring to FIGS. 6 and 7, a shift register 400 acting as the gate driver 400 of FIG. 4 receives a scanning start signal STV and first and second clock signals CLK1 and CLK2 from the signal controller 600. The shift register 400 includes a plurality of stages (ST1, STj−1, STj, STj+1, and STn+1) connected to gate lines, respectively. The plurality of stages ST1, STj−1, STj, STj+1, and STn+1 are subordinately connected to each other, and receive the scanning start signal STV and the first and second clock signals ClK1 and CLK2.

If each of the clock signals CLK1 and CLK2 is high, the gate-on voltage Von is preferably applied, and if each of the clock signals CLK1 and CLK2 is low, the gate-off voltage Voff is preferably applied.

Each of the stages ST1, STj−1, STj, STj+1, and STn+1 includes a set terminal S, a gate-off voltage terminal GV, a pair of clock terminals CK1 and CK2, a reset terminal R, a gate output terminal OUT1, and a carry output terminal OUT2.

In each of the stages, as an example, the set terminal S of the j-th stage STj is supplied with a carry output of a previous stage ST(j−1), that is, a previous carry output Cout(j−1), and the reset terminal R thereof is supplied with a gate output of a next stage ST(j+2), that is, a next gate output Gout(j+1). The clock terminals CK1 and CK2 thereof receive the clock signals CLK1 and CLK2, respectively, and the gate voltage terminal GV receives the gate-off voltage Voff. The gate output terminal OUT1 outputs a gate output Gout(j), and the carry output terminal OUT2 outputs a carry output Cout(j).

The first stage of the shift register 400 is supplied with the scanning start signal STV instead of the previous carry output. When the first and second clock terminals CK1 and CK2 of the j-th stage receive the first and second clock signals CLK1 and CLK2, respectively, the first clock terminals CK1 of the (j−1)-th stage ST(j−1) and the (j+1)-th stage ST(j+1) receive the second clock signal CLK2 and the clock terminals CK2 thereof receive the first clock signal CLK1.

Referring to FIG. 7, each of the stages of the gate driver 400, for example the j-th stage, includes an input unit 420, a pull-up driving unit 430, a pull-down driving unit 440, and an output unit 450. Each of the above-described units 420, 430, 440, and 450 includes at least one NMOS transistor T1-T14, and the pull-up driving unit 430 and the output unit 450 further include capacitors C1-C4. It is understood that the NMOS transistors may be replaced by PMOS transistors. Further, the capacitors C1-C4 may comprise parasitic capacitances between a gate and either a drain or a source formed during a manufacturing process.

The input unit 420 includes three transistors T11, T10, and T5 connected in series between the set terminal S and the gate voltage terminal GV. Gates of the transistors T11 and T5 are connected with the clock terminal CK2, and the gate of the transistor T10 is connected with the clock terminal CK1. A connection node between the transistor T11 and the transistor T10 is connected with a node J1, and a connection node between the transistor T10 and the transistor T5 is connected with a node J2.

The pull-up driving unit 430 includes a transistor T4 connected between the set terminal S and the node J1, a transistor T12 connected between the clock terminal CK1 and a node J3, and a transistor T7 connected between the clock terminal CK1 and a node J4. The transistor T4 includes a gate and a drain commonly connected with the set terminal S and a source connected with the node J1, and the transistor T12 includes a gate and a drain commonly connected with the clock terminal CK1 and a source connected with the node J3. The transistor T7 has a gate connected with the node J3 and, at the same time, with the clock terminal CK1 via the capacitor C1, a drain connected with the clock terminal CK1, and a source connected with the node J4. The capacitor C2 is connected between the node J3 and the node J4.

The pull-down driving unit 440 includes transistors T6, T9, T13, T8, T3, and T2 applied with the gate-off voltage Voff via sources thereof for outputting to the nodes J1, J2, J3, and J4. A gate and a drain of the transistor T6 are connected with the reset terminal R and the node J1, respectively. Gates of the transistors T13 and T8 are commonly connected with the node J2, and drains thereof are connected with the nodes J3 and J4, respectively. A gate of the transistor T3 is connected with the node J4, and a gate of the transistor T2 is connected with the reset terminal R. Drains of the transistors T3 and T2 are connected with the node J2.

The output unit 450 includes a pair of transistors T1 and T14 and the capacitor C3. Drains and gates of the transistors T1 and T14 are connected with the clock terminal CK1 and the output terminals OUT1 and OUT2, and gates thereof are connected with the node J1. The capacitor C3 is connected between the gate and the drain of the transistor T1, that is, the node J1 and the node J2. The source of the transistor T1 is also connected with the node J2.

An operation of such a stage is described below.

For purposes of convenience, a voltage corresponding with the high levels of the clock signals CLK1 and CLK2 is referred to as a high voltage, and a voltage corresponding with the low levels of the clock signals CLK1 and CLK2, which is the same as the magnitude of the gate-off voltage Voff, is referred to as a low voltage.

When the clock signal CLK2 and the previous gate output signal Gout(j−1) (or the scanning start signal STV) are high, the transistors T11, T5, and T4 turn on. Two transistors T11 and T4 transmit the high voltage to the node J1, and the transistor T5 transmits the low voltage to the node J2. Thus, the transistors T1 and T14 turn on and the clock signal CLK1 is transmitted to the output terminals OUT1 and OUT2. Because a voltage at the node J2 and the clock signal CLK1 are low, the output voltages Gout(j) and Cout(j) are also low. Simultaneously, the capacitor C3 is charged with a voltage of a magnitude corresponding to a difference between the high voltage and the low voltage.

Therefore, when the clock signal CLK1 and the next gate output Gout(j+1) are low and a voltage at the node J2 is also low, the transistors T10, T9, T12, T13, T8, and T2, which have the gates connected thereto, are turned off.

Subsequently, when the clock signal CLK2 becomes low, the transistors T11 and T5 are turned off, and when the clock signal CLK1 becomes high, an output voltage of the transistor T1 and a voltage at the node J2 become the high voltage. When the high voltage is applied to the gate of the transistor T10, the potential of the source connected with the node J2 is also the high voltage, and therefore a potential difference between the gate and the source becomes 0 and the transistor T10 remains turned off Accordingly, the node J1 is in a floating state and a potential of the node J1 increases proportionally with the high voltage by the capacitor C3.

Because the potentials of the clock signal CLK1 and the node J2 are the high voltage, the transistors T12, T13, and T8 are turned off. Therefore, the transistor T12 and the transistor t13 are connected in series between the high and low voltages. Thus, a potential at the node J3 becomes a voltage value divided by resistances in ohmic states at the turned-on time of two transistors T12 and T13. When the resistance in the ohmic state at the turned-on time of the transistor T13 is set to be much larger, for example, 10,000 times that of the transistor T12, a voltage at the node J3 is substantially identical to the high voltage. Accordingly, the transistor T7 is turned on to be connected in series with the transistor T8, and thereby a potential at the node J4 becomes a voltage value divided by resistances in ohmic states at the turned-on time of the two transistors T7 and T8. When the resistances in the ohmic state at the turned-on time of two transistors T7 and T8 are set to be substantially identical to each other, the potential at the node J4 becomes a middle value of the high and low voltages, and thus the transistor T3 is turned off. Because the next gate output Gout(j+1) remains low, the transistors T9 and T2 are turned off. Accordingly, the output terminals OUT1 and OUT2 are only connected with the clock signal CLK1 and they are disconnected from the low voltage to output the high voltage.

Additionally, the capacitors C1 and C2 charge voltages corresponding to potential differences developed at both terminals, respectively, and a voltage at the node J3 is lower than a voltage at the node J5.

Subsequently, when the next gate output Gout(j+1) and the clock signal CLK2 become high and the clock signal CLK1 becomes low, the transistors T9 and T2 are turned on to transmit the low voltage to the nodes J1 and J2. At this time, a voltage at the node J1 decreases to the low voltage while the capacitor C3 discharges, and a certain amount of time is needed until the voltage at the node J1 becomes the completely low voltage. Accordingly, two transistors T1 and T14 are turned on for a while after the next gate output Gout(j+1) voltage becomes high, and thereby the output terminals OUT1 and OUT2 are connected with the clock signal CLK1 to output the low voltage. When the potential at the node J1 reaches the low voltage due to complete discharge of the capacitor C3, the transistor T14 is turned off to disconnect the output terminal OUT2 from the clock signal CLK1, and the carry output Cout(j) is in a floating state and the voltage remains low. Because the output terminal OUT1 is connected with the low voltage via the transistor T2 irrespective of a turned-off state of the transistor T1, however, a low voltage is continuously output.

When the transistors T12 and T13 are turned off, the node J3 is in a floating state. Additionally, because a voltage at the node J5 is lower than a voltage at the node J4, and because the voltage at the node J3 remains lower than the voltage at the node J5 because of the capacitor C1, the transistor T7 is turned off. Simultaneously, the transistor T8 is turned off and the voltage at the node J4 decreases by the same amount, and thus the transistor T3 remains turned off. Additionally, the transistor T10 is connected with the low voltage of the gate clock signal CLK1 and the voltage at the node J2 is low, and thus the transistor T3 remains turned off.

Because the transistors t12 and T7 are turned on due to the high voltage of the clock signal CLK1 and the increase of the voltage at the node J4 turns on the transistor T3, so that the low voltage is transmitted to the node J2, the output terminal OUT1 continuously outputs the low voltage. That is, even though the voltage of the next gate output [Gout(j+1)] is low, the voltage at the node J2 is set to the low voltage.

Additionally, the gate of the transistor T10 is connected with the high voltage of the clock signal CLK1 and the voltage at the node J2 is the low voltage, and thus the transistor T10 is turned on to transmit the voltage at the node J2 to the node J1. On the other hand, the drains of two transistors T1 and T14 are connected with the clock terminal CK1 so as to be continuously applied with the clock signal CLK1. More specifically, the transistor T1 has a larger size than the other transistors, and thereby a parasitic capacitance between the gate and the drain thereof is sufficiently large such that voltage variation of the drain may affect a gate voltage. Accordingly, an increase of the gate voltage due to the parasitic capacitance between the gate and the drain of the transistor T1 on the high voltage of the clock signal CLK1 turns on the transistor T1. In this case, such voltage prevents the transistor T1 from turning on so that the gate voltage of the transistor T1 maintains the low voltage by transmitting the low voltage at the node J2 to the node J1.

The voltage at the node J1 maintains the low voltage until the voltage of the previous carry output Cout(j-1) becomes high. The voltage at the node J2 is the low voltage via the transistor T3 when the clock signal CLK1 is high and the clock signal CLK2 is low. The voltage at the node J2 is the low voltage via the transistor T5 when the clock signal CLK1 is low and the clock signal CLK2 is high.

In addition, the transistor T6 is supplied with the initializing signal INT output from the last dummy stage (not shown) to transmit the gate-off voltage Voff to the node J1, thereby setting the voltage at the node J1 to be the low voltage again.

Each stage 400 of the gate driver generates the carry signal Cout(j) and the gate output Gout(j) synchronized with the clock signals CLK1 and CLK2 according to the previous carry signal Cout(j-1) and the subsequent gate output Gout (j+1).

The transistor T1 having the output function of the gate driver 400 will be described with reference to FIG. 8 and FIG. 9 in detail. A description of the above-described constituent elements is omitted.

Initially, a gate metal layer 125 is formed on a first substrate. A gate insulating layer 140 having an opening 186 is formed on the gate metal layer 125. A semiconductor island 155 is formed on the gate insulating layer 140. A source electrode 172a with a "U" shape is formed on the semiconductor island 155, and the source electrode 172a encloses a drain electrode 172b on the semiconductor island 155. In this exemplary embodiment, the wide portion of the source electrode 172a overlaps the gate metal layer 125, and is an approximate rectangle. Accordingly, the gate metal layer 125 and the wide portion of the source electrode 172a form a capacitor C31.

A passivation layer 180q including an opening 186 is formed on the source electrode 172a and the drain electrode 172b, and a connecting member 194 is formed on the passivation layer 180q. The connecting member 194 is connected to the gate metal layer 125 through the opening of the gate insulating layer 140 and the passivation layer 180q. In this exemplary embodiment, the contact hole 186 may be formed by simultaneous photolithography of the passivation layer 180q and the gate insulating layer 140. Furthermore, the connecting member 194 may be simultaneously formed with the same material as the pixel electrode 191 through photolithography after forming the passivation layer 180q.

Also, the connecting member 194 overlaps the wide portion of the source electrode 172a and has a relatively slimmer shape. Accordingly, the connecting member 194 and the wide portion of the source electrode 172a form a capacitor C32. Therefore, the capacitance C3 among the parasitic capacitances of the transistor T1 having the output function is the sum of the capacitances C31 and C32, and is larger than that in the case that only the parasitic capacitance C31 exists. Furthermore, although the cross-section of the electrode forming the capacitor C3 is reduced to one-half, the double capacitor may provide the same capacitance as that of the capacitor C31. When the cross-section of the capacitor C3 is reduced, the thin film transistor array panel may mount a circuit including many further constituent elements. Also, even when the semiconductor 155 is formed of a polysilicon or an oxide semiconductor, the parasitic capacitance C3 may increase such that an output reinforcement effect of the transistor T1 does not decrease. The cross-section of the electrode forming the capacitor C3 may be variously changed if necessary.

The oxide semiconductor may include one selected from the group of $Ga_2O_3$, $HfO_2$, $In_2O_3$, $ZnO$, and $SnO$. Also, the oxide semiconductor may simultaneously include $Ga_2O_3$, $In_2O_3$, and $ZnO$, or $HfO_2$, $In_2O_3$, and $ZnO$.

Additionally, the connecting member 194 connected to the gate metal layer 125 is used such that the other capacitor inside the circuit of the liquid crystal display may be increased with a similar method to the capacitance C3, as well as the other parasitic capacitances C1, C2, and C4.

While this invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. A thin film transistor array panel comprising:
a substrate including a display area and a peripheral area;
a gate metal layer disposed in the peripheral area of the substrate;
a gate insulating layer disposed on the gate metal layer;
a semiconductor disposed on the gate insulating layer;
a source electrode disposed on the semiconductor;
a first drain electrode facing the source electrode on the semiconductor;
a passivation layer disposed on the first drain electrode; and
a connecting member disposed on the passivation layer, wherein the connecting member overlaps a portion of the source electrode, and is electrically connected to the gate metal layer.

2. The thin film transistor array panel of claim 1, wherein a portion of the gate metal layer overlaps a portion of the source electrode.

3. The thin film transistor array panel of claim 2, wherein the semiconductor comprises one of a polysilicon semiconductor and an oxide semiconductor.

4. The thin film transistor array panel of claim 1, wherein the gate insulating layer comprises a first opening, the passivation layer comprises a second opening positioned at the same position as the first opening, and the contact hole comprises the first opening and the second opening.

5. The thin film transistor array panel of claim 1, wherein the connecting member comprises one of indium tin oxide (ITO) and indium zinc oxide (IZO).

6. The thin film transistor array panel of claim 1, further comprising:
a thin film transistor disposed on the display area; and
a pixel electrode connected to the thin film transistor.

* * * * *